US011024454B2

(12) United States Patent
Kim et al.

(10) Patent No.: US 11,024,454 B2
(45) Date of Patent: Jun. 1, 2021

(54) HIGH PERFORMANCE INDUCTORS

(71) Applicant: QUALCOMM Incorporated, San Diego, CA (US)

(72) Inventors: Daeik Daniel Kim, Del Mar, CA (US); Mario Francisco Velez, San Diego, CA (US); Changhan Hobie Yun, San Diego, CA (US); Niranjan Sunil Mudakatte, San Diego, CA (US); Jonghae Kim, San Diego, CA (US); Chengjie Zuo, San Diego, CA (US); David Francis Berdy, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 97 days.

(21) Appl. No.: 15/191,203

(22) Filed: Jun. 23, 2016

(65) Prior Publication Data
US 2017/0110237 A1   Apr. 20, 2017

Related U.S. Application Data

(60) Provisional application No. 62/242,720, filed on Oct. 16, 2015.

(51) Int. Cl.
*H01F 5/00* (2006.01)
*H01F 27/28* (2006.01)
(Continued)

(52) U.S. Cl.
CPC ..... *H01F 27/2847* (2013.01); *H01F 17/0013* (2013.01); *H01F 41/04* (2013.01);
(Continued)

(58) Field of Classification Search
CPC .. H01F 17/0006; H01F 17/02; H01F 17/0013; H01F 2027/2809; H01F 17/0033;
(Continued)

(56) References Cited

U.S. PATENT DOCUMENTS 4,313,152 A     1/1982   Vranken
4,331,990 A  *  5/1982   Frandsen ............. G11B 5/5521
                                                          310/13
(Continued)

FOREIGN PATENT DOCUMENTS

CN       104011812 A     8/2014
GB         2337863 A    12/1999
(Continued)

OTHER PUBLICATIONS

International Search Report and Written Opinion—PCT/US2016/053620—ISA/EPO—dated Dec. 8, 2016.

*Primary Examiner* — Alexander Talpalatski
*Assistant Examiner* — Joselito S. Baisa
(74) *Attorney, Agent, or Firm* — Muncy, Geissler, Olds & Lowe, P.C.

(57) ABSTRACT

Disclosed is an inductor device including a first curved metal plate, a second curved metal plate below and substantially vertically aligned with the first curved metal plate, and a first elongated via vertically aligned between the first curved metal plate and the second curved metal plate, the first elongated via configured to conductively couple the first curved metal plate to the second curved metal plate and having an aspect ratio of a width to a height of the first elongated via of at least approximately 2 to 1.

15 Claims, 7 Drawing Sheets

(51) Int. Cl.
*H01F 41/04* (2006.01)
*H03H 7/01* (2006.01)
*H03F 15/00* (2006.01)
*H01F 17/00* (2006.01)
*H01F 27/24* (2006.01)

(52) U.S. Cl.
CPC ........... *H01F 41/041* (2013.01); *H03F 15/00* (2013.01); *H03H 7/0138* (2013.01); *H01F 2017/002* (2013.01); *H01F 2017/004* (2013.01)

(58) Field of Classification Search
CPC .. H01F 2017/004; H01L 23/645; H01L 28/10
USPC .......................................................... 336/223
See application file for complete search history.

(56) References Cited

U.S. PATENT DOCUMENTS

| | | | | |
|---|---|---|---|---|
| 5,492,856 A * | 2/1996 | Ikeda | ....................... | H01L 27/08 257/E27.046 |
| 5,499,005 A * | 3/1996 | Gu | ........................... | H01P 3/088 333/161 |
| 5,777,539 A * | 7/1998 | Folker | ................. | H01F 27/2804 336/200 |
| 5,831,331 A * | 11/1998 | Lee | ........................ | H01L 23/645 257/659 |
| 5,844,451 A * | 12/1998 | Murphy | ................ | H03H 7/0115 333/185 |
| 6,124,779 A * | 9/2000 | Yamamoto | ........... | H01F 17/0013 29/604 |
| 6,549,112 B1 * | 4/2003 | Gallina | ................... | H01F 5/003 336/200 |
| 6,580,350 B1 * | 6/2003 | Kobayashi | .......... | H01F 17/0013 336/192 |
| 6,665,931 B2 * | 12/2003 | Yamaguchi | ............. | H01L 24/78 29/850 |
| 7,023,209 B2 * | 4/2006 | Zhang | .................. | G01R 33/345 324/318 |
| 7,064,411 B2 * | 6/2006 | Hashizume | ......... | H01F 17/0006 257/516 |
| 7,129,145 B2 * | 10/2006 | Kawamura | ......... | H01L 23/5227 438/381 |
| 7,151,298 B1 * | 12/2006 | Eggert | .................... | H01L 23/60 257/355 |
| 7,656,037 B2 * | 2/2010 | Hommel | ............. | H01L 23/5225 257/758 |
| 7,812,701 B2 * | 10/2010 | Lee | ..................... | H01F 27/2804 336/200 |
| 8,227,851 B2 * | 7/2012 | Aoki | ................. | G06K 19/07749 257/314 |
| 8,289,118 B2 * | 10/2012 | Chiu | ................... | H01F 17/0013 336/147 |
| 8,723,632 B2 * | 5/2014 | Okumura | ................ | H01F 5/003 336/192 |
| 9,009,951 B2 * | 4/2015 | Chang | ..................... | H01F 5/003 29/607 |
| 9,041,152 B2 * | 5/2015 | Luo | ........................ | H01L 28/10 257/531 |
| 9,123,982 B2 * | 9/2015 | Ye | ............................ | H01P 5/184 |
| 9,165,706 B2 * | 10/2015 | Ishida | ................. | H01F 17/0013 |
| 9,431,473 B2 * | 8/2016 | Lo | ............................ | H01F 21/00 |
| 9,449,753 B2 * | 9/2016 | Kim | .................. | H01F 27/2804 |
| 9,601,254 B2 * | 3/2017 | Sharp | .................. | H01F 27/2876 |
| 9,647,483 B1 * | 5/2017 | Bana | ........................ | H02J 7/025 |
| 9,929,229 B2 * | 3/2018 | Ahn | .................. | H01F 17/0013 |
| 9,976,224 B2 * | 5/2018 | Jeong | ...................... | C25D 7/001 |
| 10,553,353 B2 * | 2/2020 | Vanukuru | ........... | H01F 17/0013 |
| 2007/0139151 A1 | 6/2007 | Nussbaum | | |
| 2008/0174396 A1 | 7/2008 | Choi et al. | | |
| 2008/0265429 A1 | 10/2008 | Kuwajima | | |
| 2009/0146770 A1 * | 6/2009 | Lee | ..................... | H01F 17/0006 336/200 |
| 2009/0153282 A1 * | 6/2009 | Taoka | ................. | H01F 17/0013 336/200 |
| 2012/0146741 A1 * | 6/2012 | Yen | ..................... | H01L 23/5223 333/25 |
| 2013/0278374 A1 * | 10/2013 | Thorslund | ............... | H01F 27/29 336/200 |
| 2013/0293482 A1 | 11/2013 | Burns et al. | | |
| 2014/0035702 A1 | 2/2014 | Black et al. | | |
| 2014/0225702 A1 * | 8/2014 | Yazaki | ................ | H01F 17/0013 336/200 |
| 2014/0240072 A1 | 8/2014 | Lan et al. | | |
| 2014/0266494 A1 | 9/2014 | Lan et al. | | |
| 2014/0327510 A1 | 11/2014 | Kim et al. | | |
| 2015/0061813 A1 * | 3/2015 | Kim | .................... | H01F 17/0013 336/200 |
| 2015/0130579 A1 * | 5/2015 | Kim | .................... | H01F 27/2804 336/200 |

FOREIGN PATENT DOCUMENTS

| | | |
|---|---|---|
| JP | H09162354 A | 6/1997 |
| JP | 2000286125 A | 10/2000 |
| JP | 2005528620 A | 9/2005 |
| JP | 2013120924 A | 6/2013 |
| JP | 2013122940 A | 6/2013 |
| WO | 2013108862 A1 | 7/2013 |
| WO | 2015030976 A1 | 3/2015 |

* cited by examiner

HIGH PERFORMANCE INDUCTORS

CROSS-REFERENCE TO RELATED APPLICATIONS

The present application for patent claims the benefit of U.S. Provisional Application No. 62/242,720, entitled "HIGH PERFORMANCE INDUCTORS," filed Oct. 16, 2015, assigned to the assignee hereof, and expressly incorporated herein by reference in its entirety.

FIELD OF DISCLOSURE

This disclosure relates generally to inductors and more specifically, but not exclusively, to spiral inductors.

BACKGROUND

Inductors are ubiquitous passive analog electronic components that are used in a myriad of power regulation, frequency control, and signal conditioning applications in a range of devices including personal computers, tablet computers, wireless mobile handsets, etc.

Conventional spiral inductors include a top metal layer, a bottom metal layer, and a via connecting the top metal layer to the bottom metal layer. The via allows the induced current to flow from the top metal layer to the bottom metal layer. Such a via is typically in the shape of a cylinder, a square, an octagon, or a downwardly tapered trapezoid, and the effective diameter of the via limits the performance of the inductor by, for example, increasing the resistance of the inductor. That is, the via's resistance limits the inductor's quality factor (also referred to as the Q-factor or simply "Q").

Inductors can be used in many applications, one being in a power amplification (PA) circuit for a semiconductor device. In such an implementation, the top metal layer is formed on the top of a substrate (e.g., an organic laminate substrate) and the via extends through the substrate to a metal layer beneath the substrate (i.e., the bottom metal layer).

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An inductor device includes a first curved metal plate, a second curved metal plate below and substantially vertically aligned with the first curved metal plate, and a first elongated via vertically aligned between the first curved metal plate and the second curved metal plate, the first elongated via configured to conductively couple the first curved metal plate to the second curved metal plate and having an aspect ratio of a width to a height of the first elongated via of at least approximately 2 to 1.

A method of forming an inductor device includes forming a first curved metal plate, forming a second curved metal plate below and substantially vertically aligned with the first curved metal plate, and forming a first elongated via vertically aligned between the first curved metal plate and the second curved metal plate, the first elongated via configured to conductively couple the first curved metal plate to the second curved metal plate and having an aspect ratio of a width to a height of the first elongated via of at least approximately 2 to 1.

An inductor device includes a first conductive means, a second conductive means below and substantially vertically aligned with the first conductive means, and a first elongated via vertically aligned between the first conductive means and the second conductive means, the first elongated via configured to conductively couple the first conductive means to the second conductive means and having an aspect ratio of a width to a height of the first elongated via of at least approximately 2 to 1.

A non-transitory computer-readable medium storing computer executable code, includes code to cause a machine to form a first curved metal plate, cause a machine to form a second curved metal plate below and substantially vertically aligned with the first curved metal plate, and cause a machine to form a first elongated via vertically aligned between the first curved metal plate and the second curved metal plate, the first elongated via configured to conductively couple the first curved metal plate to the second curved metal plate and having an aspect ratio of a width to a height of the first elongated via of at least approximately 2 to 1.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
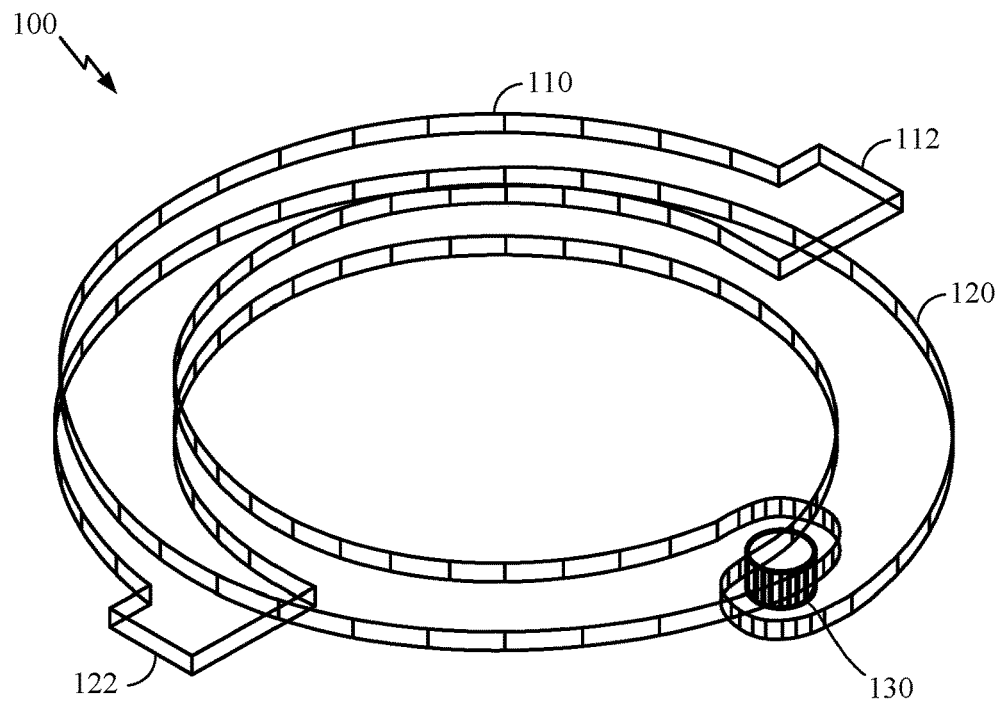
FIGS. 1A and 1B illustrate an exemplary conventional inductor.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and drawings.

DETAILED DESCRIPTION

Disclosed is an inductor device including a first curved metal plate, a second curved metal plate below and substantially vertically aligned with the first curved metal plate, and a first elongated via vertically aligned between the first curved metal plate and the second curved metal plate, the first elongated via configured to conductively couple the first curved metal plate to the second curved metal plate and having an aspect ratio of a width to a height of the first elongated via of at least approximately 2 to 1.

These and other aspects of the disclosure are disclosed in the following description and related drawings directed to specific embodiments of the disclosure. Alternate embodiments may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any embodiment described herein as "exemplary" and/or "example" is not necessarily to be construed as preferred or advantageous over other embodiments. Likewise, the term "embodiments of the disclosure" does not require that all embodiments of the disclosure include the discussed feature, advantage or mode of operation.

Further, certain embodiments are described in terms of sequences of actions to be performed by, for example, elements of a computing device. It will be recognized that various actions described herein can be performed by, or caused to be performed by, specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that, upon execution, would cause an associated processor to perform, or cause to be performed, the functionality described herein. Thus, the various aspects of the disclosure may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1B:
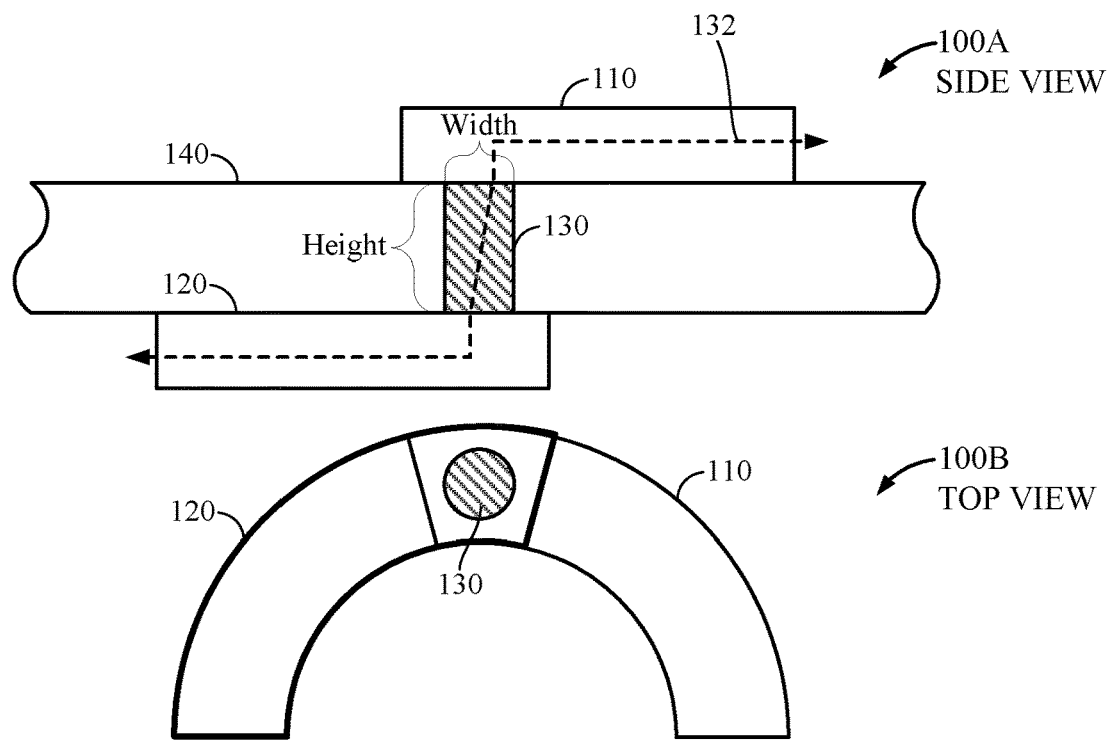

FIGS. 1A and 1B illustrate an exemplary conventional inductor 100. As shown in FIG. 1A, the inductor 100 may include a first curved metal plate 110 (e.g., a top metal layer, also referred to as a "trace"), a second curved metal plate 120 (e.g., a bottom metal layer, also referred to as a "trace") substantially co-located below the first curved metal plate 110, and a cylindrical via 130 between the first curved metal plate 110 and the second curved metal plate 120. The via 130 conductively couples the first curved metal plate 110 to the second curved metal plate 120 through an insulating layer (not shown in FIG. 1A). The first curved metal plate 110 may include a first terminal 112 at one end, and the second curved metal plate 120 may include a second terminal 122 at one end. The first terminal 112 and the second terminal 122 may be configured to connect to external components for input and output of current through the inductor 100.

FIG. 1B shows a side view 100A and a top view 100B of the inductor 100 in FIG. 1A. As shown in FIG. 1B, an induced current 132 may traverse the inductor 100 from the first curved metal plate 110 through the via 130 to the second curved metal plate 120 and vice versa. The via 130 may be drilled or cut through an insulating layer 140 of a coreless substrate of a semiconductor device, and therefore have a height of approximately 40 µm. The first curved metal plate 110 may be on "top" of the insulating layer 140 and the second curved metal plate 120 may be on the "bottom" of the insulating layer 140. A "coreless" substrate for a semiconductor device means that the semiconductor device does not include the "core" insulating layers that increase the rigidity of the semiconductor device. This allows the coreless substrate to be much thinner than a "buildup" substrate, which includes these core insulating layers. For example, a semiconductor device utilizing a coreless substrate may be approximately 430 µm thick, while a semiconductor device utilizing a buildup substrate may be approximately 1,150 µm due to the additional core layers.

Although FIG. 1B illustrates the via 130 in the shape of a cylinder, the via 130 may be shaped as a square, an octagon, or a downwardly tapered trapezoid, as is known in the art. The effective diameter of the via 130 limits the performance of the inductor 100, insofar as the resistance of the via 130 is inversely proportional to the area of the via 130. Thus, the resistance of the via 130 adds to the resistance of the inductor 100 and thereby limits the Q-factor of the inductor 100.

Accordingly, the present disclosure provides a two layer inductor that includes an elongated via between the top metal layer and the bottom metal layer of the inductor. This configuration may result in a high-performance radio frequency (RF) inductor implementation, such as in a coreless substrate, that improves power amplification (PA) performance by reducing loss in the inductor by approximately 7.25%, or as much as 10%, with no manufacturing process change and minimal area increase (e.g., 2.3%). In other examples, a spiral inductor may include a first metal layer, a second metal layer, and a third metal layer co-located on a substrate, where the second metal layer acts as a transition via between the first metal layer and the third metal layer. This configuration may result in low-resistance for the direct current (DC) for less heat dissipation and higher Q-factor performance at low frequencies and radio frequencies. These advantages are achieved by integrating such a high-performance inductor within a coreless substrate, along with the increased metal of the second metal layer providing a higher thermal conductance through the inductor.

Figure 2A:
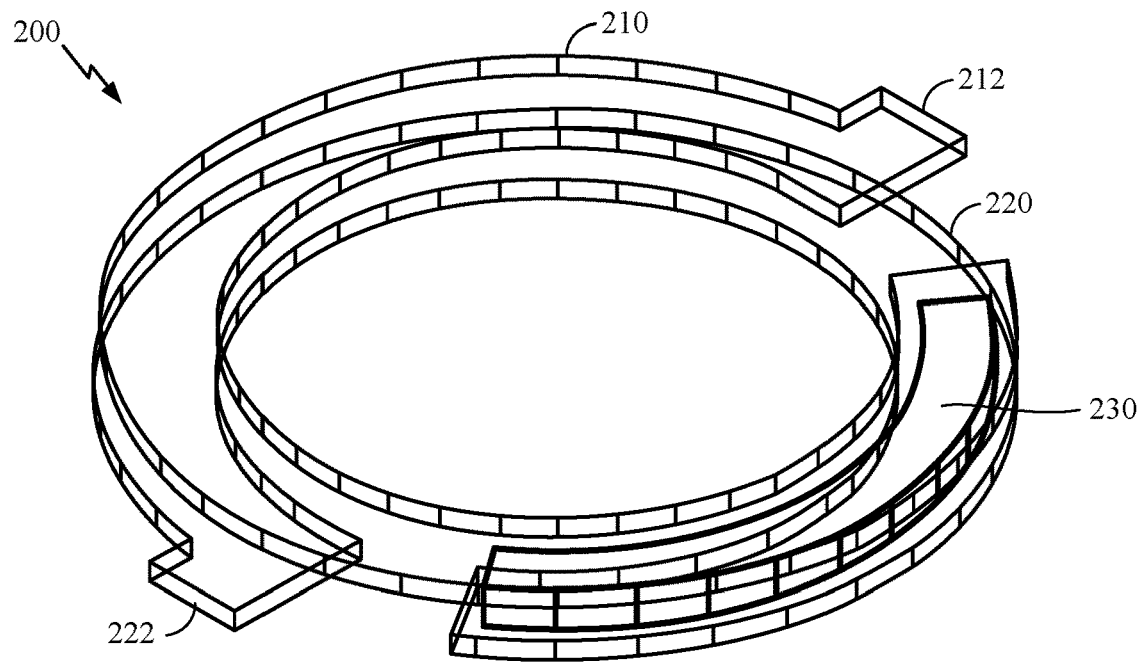
FIGS. 2A and 2B illustrate an exemplary inductor in accordance with some examples of the disclosure.
Figure 2B:
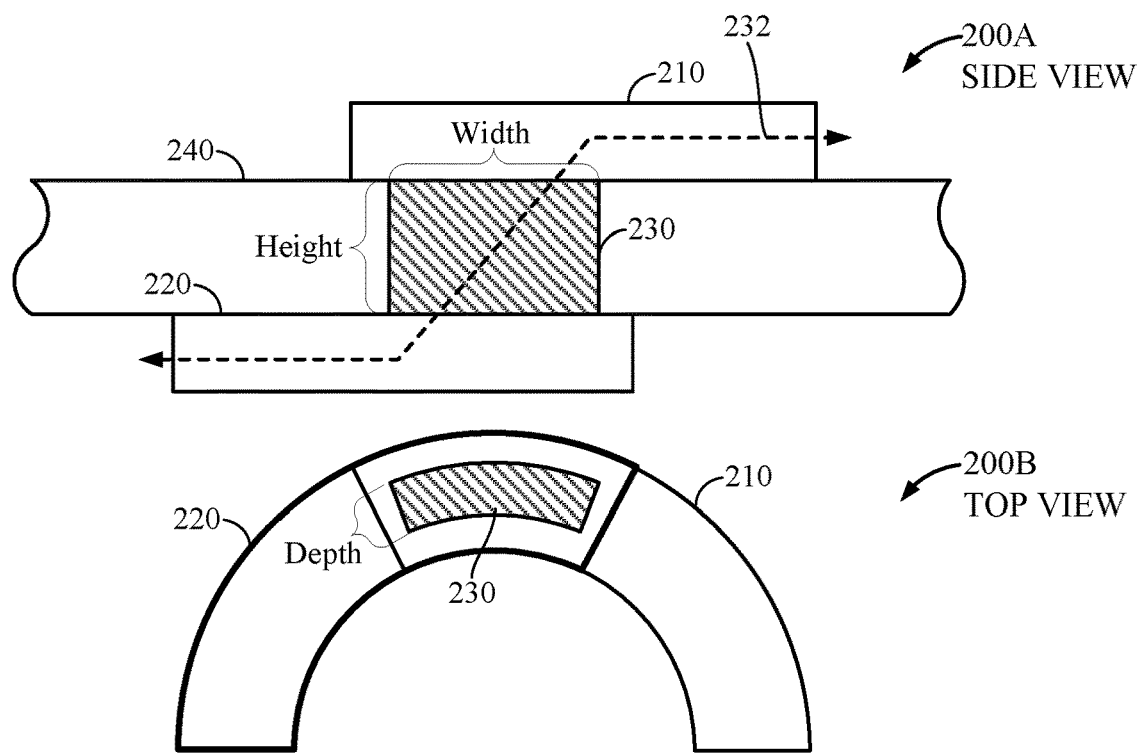

FIGS. 2A and 2B illustrate an exemplary inductor 200 in accordance with some examples of the disclosure. As shown in FIG. 2A, the inductor 200 may include a first curved metal plate 210 (e.g., a "top" metal layer, also referred to as a "trace"), a second curved metal plate 220 (e.g., a "bottom" metal layer, also referred to as a "trace") substantially co-located below and parallel to the first curved metal plate 210, and an elongated via 230 between the first curved metal plate 210 and the second curved metal plate 220. The elongated via 230 conductively couples the first curved metal plate 210 to the second curved metal plate 220 through an insulating layer (not shown in FIG. 2A). The first curved metal plate 210 may include a first terminal 212 at one end, and the second curved metal plate 220 may include a second terminal 222 at one end. The first terminal 212 and the second terminal 222 may be configured to connect to external components for input and output of current through the inductor 200.

FIG. 2B shows a side view 200A and a top view 200B of the inductor 200. As shown in FIG. 2B, an induced current 232 may traverse the inductor 200 from the first curved metal plate 210 through the elongated via 230 to the second curved metal plate 220 and vice versa. The elongated via 230 may be drilled or cut through an insulating layer 240 of a coreless substrate of a semiconductor device. The first curved metal plate 210 may be on "top" of the insulating layer 240 and the second curved metal plate 220 may be on the "bottom" of the insulating layer 240.

As illustrated in FIGS. 2A and 2B, the elongated via 230 may substantially follow the curve of and be narrower than the first curved metal plate 210 and the second curved metal plate 220. The elongated via 230 may provide a longer and flatter transition between the first curved metal plate 210 and the second curved metal plate 220 for the induced current 232. The elongated via 230 may have an aspect ratio of width-to-height of approximately 2-to-1 (2:1) or larger. As shown in FIG. 2B, the "width" (also referred to as the "length") of the elongated via 230 is the dimension of the elongated via 230 along the curve (substantially parallel to the inside and outside edges) of the first and second curved metal plates 210 and 220. The "height" of the elongated via 230 is the dimension of the elongated via 230 between the first and second curved metal plates 210 and 220. The depth of the elongated via 230 is the dimension of the elongated via 230 between (substantially perpendicular to) the inside and outside edges of the first and second curved metal plates 210 and 220.

Thus, unlike the induced current 132 having to make a high-resistance 90 degree bend to traverse the via 130 from the first curved metal plate 110 to the second curved metal plate 120, as in the inductor 100, the induced current 232 follows a longer, flatter, and therefore lower resistance path as it traverses the elongated via 230 from the first curved metal plate 210 and through to the second curved metal plate 220. As an example, where the thickness of the insulating layer 240 is approximately 40 µm, the height of the elongated via 230 may be approximately 40 µm and the width of the elongated via 230 may be approximately 80 µm.

Note that although FIGS. 2A and 2B illustrate the inductor 200 as having a circular shape, it will be appreciated that the inductor 200 may have other shapes, such as an octagonal shape.

The insulating layer 240 may be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), or other material having similar insulating and structural properties, as is known in the art. The first curved metal plate 210, the second curved metal plate 220, and the elongated via 230 may be one or more layers of aluminum (Al), copper (Cu), tin (Sn), nickel (Ni), gold (Au), silver (Ag), or other suitable electrically conductive material, as is known in the art.

The configuration of the inductor 200 results in a lower DC resistance and a higher Q-factor for the inductor 200. For example, the Q-factor of the inductor 200 may be 131.6 at 1 GHz, whereas the Q-factor of the inductor 100 may be 122.7 at 1 GHz. The configuration of the inductor 200 may further result in a high-performance RF inductor implementation that improves PA performance by reducing loss in the inductor 200 by approximately 7.25%, or as much as 10%, with no manufacturing process change and minimal area increase on the insulating layer 240 (e.g., 2.3%).

Figure 3:
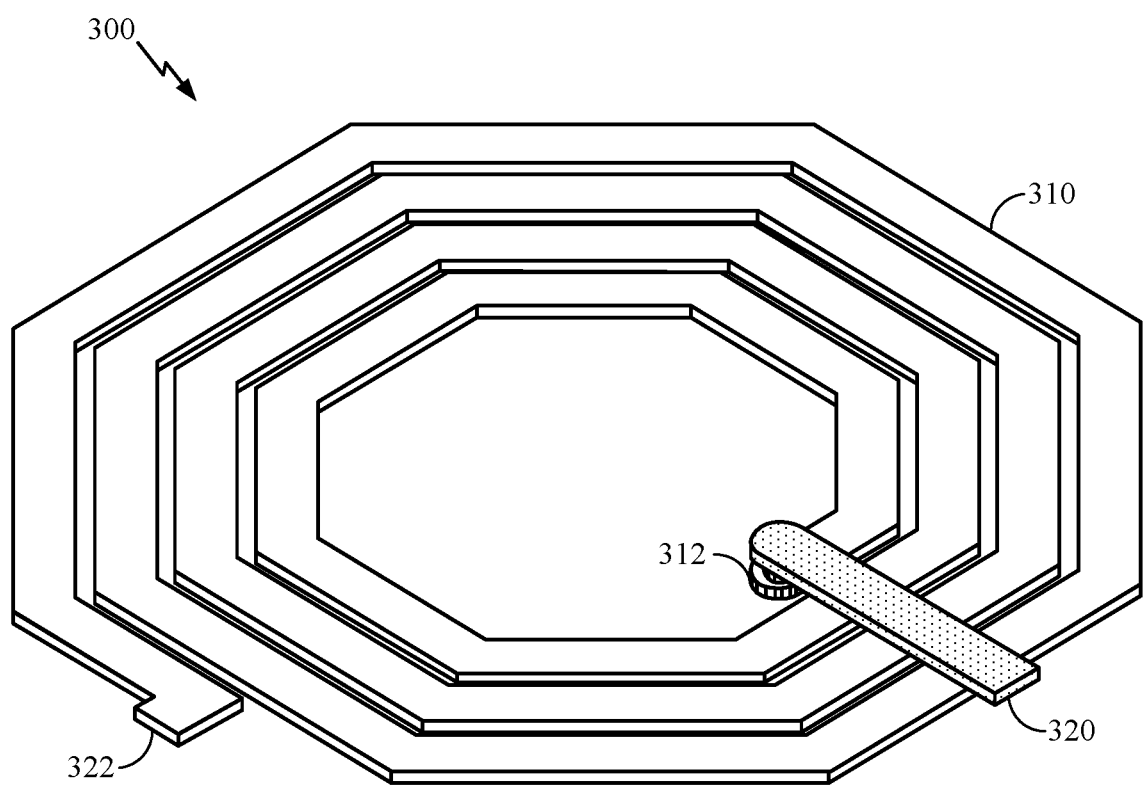
FIG. 3 illustrates an exemplary conventional spiral inductor.

FIG. 3 illustrates an exemplary conventional spiral inductor 300. As shown in FIG. 3, the spiral inductor 300 may include a spiral metal plate 310. The spiral metal plate 310 may include a first terminal 312 at one end conductively coupled to an interconnect 320 and a second terminal 322 at the other end. The first terminal 312, via the interconnect 320, and the second terminal 322 may be configured to connect to external components for input and output of current through the spiral inductor 300. For example, a current may enter the spiral inductor 300 at the first terminal 312 via the interconnect 320, travel along the spiral metal plate 310, and exit the spiral inductor 300 at the second terminal 322. Alternatively, current may travel the same path in the opposite direction.

Figure 4:
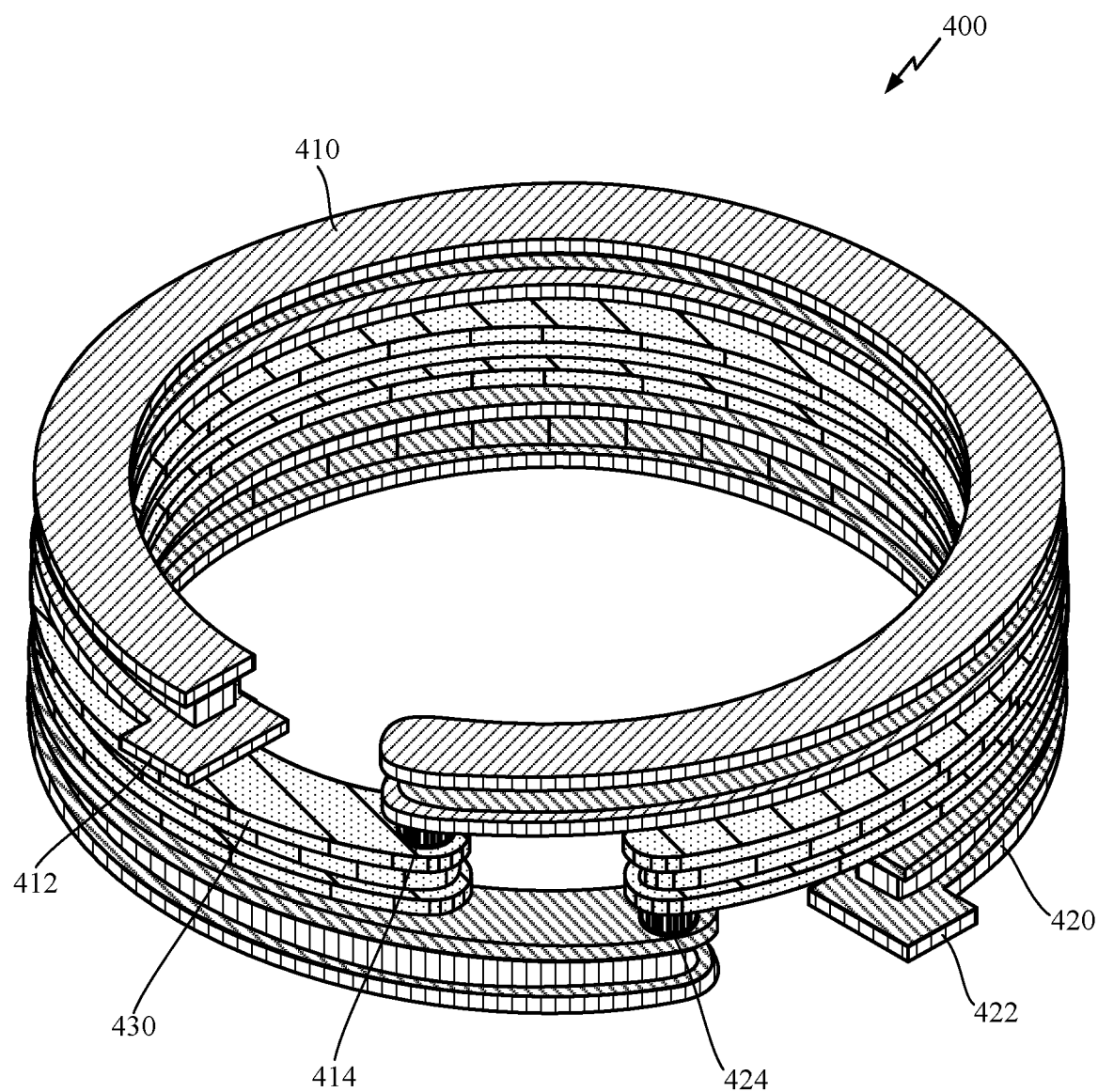
FIG. 4 illustrates an exemplary stacked co-spiral inductor in accordance with some examples of the disclosure.

FIG. 4 illustrates an exemplary stacked co-spiral inductor 400 in accordance with some examples of the disclosure. As shown in FIG. 4, the stacked co-spiral inductor 400 may include a first curved metal plate 410, a second curved metal plate 420 substantially co-located below the first curved metal plate 410, and a third curved metal plate 430 co-located between the first curved metal plate 410 and the second curved metal plate 420. As illustrated in FIG. 4, each of the first curved metal plate 410, the second curved metal plate 420, and the third curved metal plate 430 may consist of multiple layers of metal. For example, each curved metal layer may consist of top and bottom metal layers connected by a middle metal layer.

The third curved metal plate 430 may be configured to conductively couple the first curved metal plate 410 to the second curved metal plate 420. The first curved metal plate 410 may include a first terminal 412 at one end and a first via 414 at the other end. The second curved metal plate 420 may include a second terminal 422 at one end and a second via 424 at the other end. The first terminal 412 and the second terminal 422 may be configured to connect to external components for input and output of current through the stacked co-spiral inductor 400.

The first via 414 may be configured to directly couple the first curved metal plate 410 to the third curved metal plate 430. The second via 424 may be configured to directly couple the second curved metal plate 420 to the third curved metal plate 430. For example, a current may enter the stacked co-spiral inductor 400 at the first terminal 412, travel along the first curved metal plate 410 to the first via 414, then from the first via 414 through the third curved metal plate 430 to the second via 424, and from the second via 424 through the second curved metal plate 420 to the second terminal 422 to exit the stacked co-spiral inductor 400. Alternatively, the current may travel the same path in the opposite direction.

Note that although the first via 414 and the second via 424 are illustrated as cylindrical vias, similar to the via 130, it will be appreciated that the first via 414 and the second via 424 may be elongated vias, similar to the elongated via 230, and may provide the same advantages.

The presence of the third curved metal plate 430 may provide better (i.e., lower) DC resistance and thermal conductivity along with lower inductor power loss compared to a conventional spiral inductor, such as the spiral inductor 300. For example, the configuration of the stacked co-spiral inductor 400 may provide a 60% lower power loss than a conventional single layer spiral inductor (e.g., spiral inductor 300). When integrated with a coreless substrate, the stacked co-spiral inductor 400 may also reduce external components, cost, and area on the substrate. For example, the stacked co-spiral inductor 400 may take up an area of 1.41 mm$^2$ on the substrate compared to an area of 1.69 mm$^2$ for the spiral inductor 300. The DC resistance of the stacked co-spiral inductor 400 may be approximately 23.1 mOhm for 7 nanoHenries (nH), while the DC resistance of the spiral inductor 300 may be approximately 67.4 mOhm for 7 nH. The power loss at 2 Amps for the stacked co-spiral inductor 400 may be approximately 92.3 mW compared to approximately 270 mW for the spiral inductor 300. Finally, the RF resistance for the stacked co-spiral inductor 400 may be a Q-factor of approximately 103 at 1 GHz with 7 nH compared to a Q-factor of approximately 101 at 1 GHz with 7 nH for the spiral inductor 300.

The substrate may be one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other material having similar insulating and structural properties, as is known in the art. The first curved metal plate 410, the second curved metal plate 420, the third curved metal plate 430, the first via 414, and the second via 424 may be one or more layers of aluminum (Al), copper (Cu), tin (Sn), nickel (Ni), gold (Au), silver (Ag), or other suitable electrically conductive material, as is known in the art.

Note that as used herein, the terms "substantially" and "approximately" are not relative terms of degree, but rather, reflect the reality that, due to tolerances in manufacturing processes, two components may not be exactly the same size or have an exact orientation with respect to each other, or that a given component may not be an exact size. Rather, the terms "substantially" and "approximately" mean that the size, orientation, etc. of the component(s) need only be within some tolerance threshold of the described size, orientation, etc. Thus, for example, when one component is described as being "substantially" above or below another component, it means that the components are aligned vertically within some tolerance threshold. Similarly, as another example, when one component is described as being "approximately" a given size, it means that the component is within a given tolerance threshold of the given size. The tolerance threshold may be determined by the capabilities of the manufacturing process, the requirements of the device and/or components being manufactured, and the like.

It will be appreciated that even if the terms "substantially" or "approximately" are not used to describe a size, orientation, etc. of component(s), it does not mean that the size, orientation, etc. of the component(s) must be exactly the described size, orientation, etc. Rather, the described size, orientation, etc. need only be within some tolerance threshold of the described size, orientation, etc.

Figure 5:
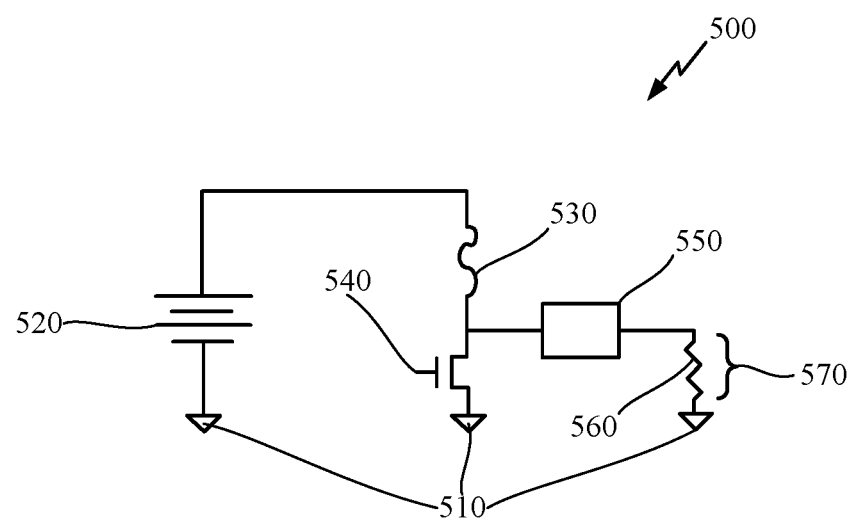
FIG. 5 illustrates an exemplary power amplification (PA) circuit with multiple inductors in accordance with some examples of the disclosure.

FIG. 5 illustrates an exemplary power amplification (PA) circuit 500 with multiple inductors in accordance with some examples of the disclosure. As shown in FIG. 5, the PA circuit 500 may include a ground 510, a power supply 520, a first inductor 530 (e.g., inductor 200 or stacked co-spiral inductor 400) coupled to the power supply 520, an input 540, such as an antenna input, coupled between the first inductor 530 and the ground 510 that gates the PA circuit 500, a bandpass filter 550 coupled between the first inductor 530 and the input 540, an RF resistive load 560 coupled between the bandpass filter 550 and the ground 510, and an output tap 570 across the RF resistive load 560. The bandpass filter 550 may include one or more inductors (e.g., inductor 200 or stacked co-spiral inductor 400) and acoustic filters.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 6:
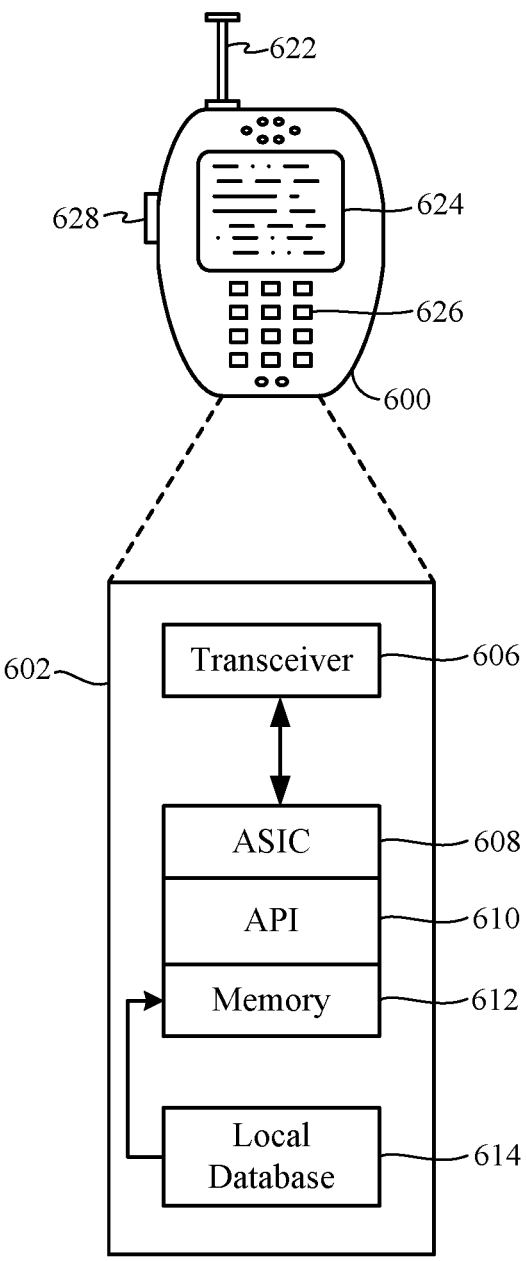
FIG. 6 illustrates exemplary user equipment (UE) having at least one inductor in accordance with some examples of the disclosure.

Inductors and circuits according to the examples above (e.g., the inductor 200, the stacked co-spiral inductor 400, and the PA circuit 500) can be used for a number of different applications, such as in the circuit components of a mobile device. Referring to FIG. 6 as an example, a user equipment (UE) 600 (here a wireless device) has a platform 602 that can receive and execute software applications, data, and/or commands transmitted from a radio access network (RAN) that may ultimately come from a core network, the Internet, and/or other remote servers and networks. Platform 602 can include inductors and PA circuits as well as a transceiver 606 operably coupled to an application specific integrated circuit (ASIC) 608, or other processor, microprocessor, logic circuit, or other data processing device. The ASIC 608 or other processor executes the application programming interface (API) 610 layer that interfaces with any resident programs in a memory 612 of the UE 600. Memory 612 can be comprised of read-only memory (ROM) or random-access memory (RAM), electrically erasable programmable ROM (EEPROM), flash cards, or any memory common to computer platforms. Platform 602 can also include a local database 614 that can hold applications not actively used in memory 612. Local database 614 is typically a flash memory cell, but can be any secondary storage device as known in the art, such as magnetic media, EEPROM, optical media, tape, soft or hard disk, or the like. Platform 602 components can also be operably coupled to external devices such as antenna 622, display 624, push-to-talk button 628, and keypad 626 among other components, as is known in the art.

The wireless communication between UE 600 and the RAN can be based on different technologies, such as code division multiple access (CDMA), wideband CDMA (W-CDMA), time division multiple access (TDMA), frequency division multiple access (FDMA), Orthogonal Frequency Division Multiplexing (OFDM), Global System for Mobile Communications (GSM), 3GPP Long Term Evolution (LTE), or other protocols that may be used in a wireless communications network or a data communications network.

Figure 7:
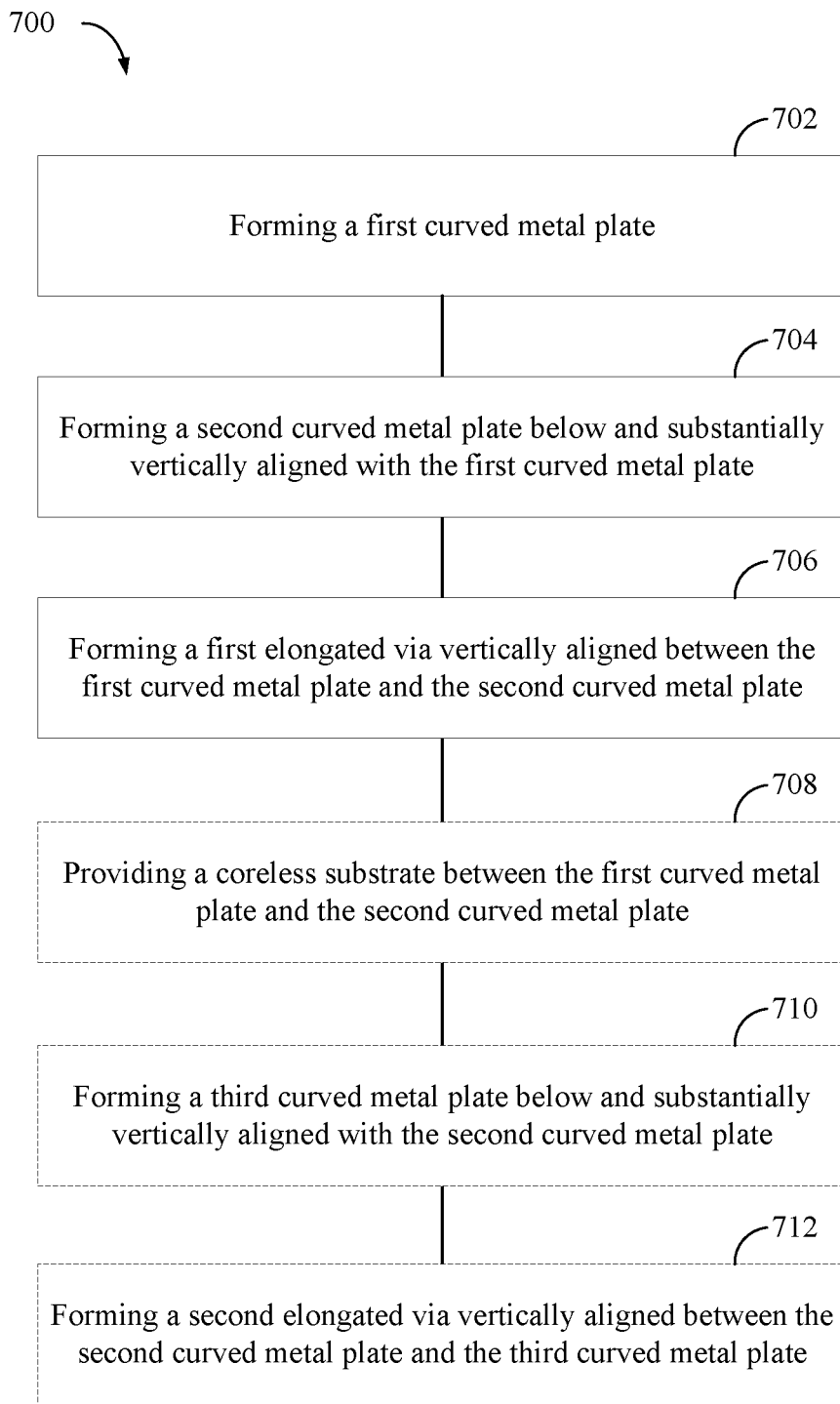
FIG. 7 illustrates an exemplary flow for forming an inductor device in accordance with some examples of the disclosure.

FIG. 7 illustrates an exemplary flow 700 for forming an inductor device, such as inductor 200, in accordance with some examples of the disclosure. The flow illustrated in FIG. 7 may be performed during a manufacturing process of the inductor device. In an embodiment, the inductor device may be one of an RF front end module, a filter, or a PA. The inductor device may be incorporated into a device selected from a group comprising a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, an RF front end module, a filter, or a PA.

At 702, the flow 700 includes forming a first curved metal plate, such as first curved metal plate 210 in FIGS. 2A and 2B. At 704, the flow 700 includes forming a second curved metal plate, such as second curved metal plate 220 in FIGS. 2A and 2B, below and substantially vertically aligned with the first curved metal plate. In an embodiment, the first curved metal plate and the second curved metal plate may be octagon shaped. The first curved metal plate and the second curved metal plate may have approximately a same length.

At 706, the flow 700 includes forming a first elongated via, such as elongated via 230 in FIGS. 2A and 2B, vertically aligned between the first curved metal plate and the second curved metal plate. The first elongated via may be configured to conductively couple the first curved metal plate to the second curved metal plate and may have an aspect ratio of a width to a height of the first elongated via of at least approximately 2 to 1. The first elongated via may be completely within a vertical perimeter defined by an inside edge and an outside edge of the first curved metal plate.

At 708, the flow 700 may optionally include providing a coreless substrate, such as insulating layer 240 in FIG. 2B, between the first curved metal plate and the second curved metal plate.

At 710, the flow 700 may optionally include forming a third curved metal plate, such as the third curved metal plate 430 in FIG. 4, below and substantially vertically aligned with the second curved metal plate.

At 712, the flow 700 may optionally include forming a second elongated via, such as the second via 424 in FIG. 4, vertically aligned between the second curved metal plate and the third curved metal plate. The second elongated via may be configured to conductively couple the second curved metal plate to the third curved metal plate and may have an aspect ratio of a width to a height of at least approximately 2 to 1.

Although FIG. 7 illustrates a particular order of operations, it will be appreciated that the operations may be performed in a different order, depending on the manufacturing process being used to form the inductor device.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements.

Nothing stated or illustrated in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block, detail, or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An inductor device, comprising:
    a first curved metal plate;
    a second curved metal plate below and substantially vertically aligned with the first curved metal plate, wherein the second curved metal plate is substantially vertically aligned with the first curved metal plate for an entire length of the second curved metal plate except a terminal end of the second curved metal plate;

a first elongated via vertically aligned between the first curved metal plate and the second curved metal plate, the first elongated via configured to conductively couple the first curved metal plate to the second curved metal plate and having an aspect ratio of a width to a height of the first elongated via of at least approximately 2 to 1;

a third curved metal plate below and substantially vertically aligned with the second curved metal plate; and a second elongated via vertically aligned between the second curved metal plate and the third curved metal plate, the second elongated via configured to conductively couple the second curved metal plate to the third curved metal plate and having an aspect ratio of a width to a height of at least approximately 2 to 1, wherein the inductor device has no more curved metal plates than the first curved metal plate, the second curved metal plate, and the third curved metal plate, wherein each of the first curved metal plate, the second curved metal plate, and the third curved metal plate consists of a top metal layer and a bottom metal layer connected by a middle metal layer, wherein the bottom metal layer of the first curved metal plate forms a first terminal end of the inductor device and the bottom metal layer of the third curved metal plate forms a second terminal end of the inductor device, and wherein the inductor device has no more terminal ends than the first terminal end and the second terminal end.

2. The inductor device of claim 1, wherein the first elongated via is completely within a vertical perimeter defined by an inside edge and an outside edge of the first curved metal plate.

3. The inductor device of claim 1, wherein the first curved metal plate and the second curved metal plate are octagon shaped.

4. The inductor device of claim 1, wherein the inductor device comprises one of a radio frequency (RF) front end module, a filter, or a power amplifier (PA).

5. The inductor device of claim 1, further comprising a coreless substrate between the first curved metal plate and the second curved metal plate.

6. The inductor device of claim 1, wherein the first curved metal plate and the second curved metal plate have approximately a same length.

7. The inductor device of claim 1, wherein the inductor device is incorporated into a device selected from a group comprising a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, an RF front end module, a filter, or a PA.

8. The inductor device of claim 1, wherein each of the first elongated via and the second elongated via has squared ends.

9. The inductor device of claim 1, wherein the first elongated via and the second elongated via are approximately a same length.

10. An inductor device, comprising:

a first conductive means;

a second conductive means below and substantially vertically aligned with the first conductive means, wherein the second conductive means is substantially vertically aligned with the first conductive means for an entire length of the second conductive means except a terminal end of the second conductive means;

a first elongated via vertically aligned between the first conductive means and the second conductive means, the first elongated via configured to conductively couple the first conductive means to the second conductive means and having an aspect ratio of a width to a height of the first elongated via of at least approximately 2 to 1;

a third conductive means below and substantially vertically aligned with the second conductive means; and a second elongated via vertically aligned between the second conductive means and the third conductive means, the second elongated via configured to conductively couple the second conductive means to the third conductive means and having an aspect ratio of a width to a height of at least approximately 2 to 1, wherein the inductor device has no more conductive means than the first conductive means, the second conductive means, and the third conductive means, wherein each of the first conductive means, the second conductive means, and the third conductive means consists of a top metal layer and a bottom metal layer connected by a middle metal layer, wherein the bottom metal layer of the first conductive means forms a first terminal end of the inductor device and the bottom metal layer of the third conductive means forms a second terminal end of the inductor device, and wherein the inductor device has no more terminal ends than the first terminal end and the second terminal end.

11. The inductor device of claim 10, wherein the first elongated via is completely within a vertical perimeter defined by an inside edge and an outside edge of the first conductive means.

12. The inductor device of claim 10, wherein the inductor device comprises one of a radio frequency (RF) front end module, a filter, or a power amplifier (PA).

13. The inductor device of claim 10, further comprising a coreless substrate between the first conductive means and the second conductive means.

14. The inductor device of claim 10, wherein the first conductive means and the second conductive means have approximately a same length.

15. The inductor device of claim 10, wherein the inductor device is incorporated into a device selected from a group comprising a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, an RF front end module, a filter, or a PA.

* * * * *